(12) United States Patent
Jackson

(10) Patent No.: US 7,747,925 B2
(45) Date of Patent: Jun. 29, 2010

(54) APPARATUS AND METHOD FOR ERROR CORRECTION CODE STRIPING

(75) Inventor: George Paul Jackson, West Haven, UT (US)

(73) Assignee: Fujifilm Corporation, Tokyo (JP)

( * ) Notice: Subject to any disclaimer, the term of this patent is extended or adjusted under 35 U.S.C. 154(b) by 1032 days.

(21) Appl. No.: 11/368,140

(22) Filed: Mar. 6, 2006

(65) Prior Publication Data

US 2007/0220396 A1 Sep. 20, 2007

(51) Int. Cl.
*G11C 29/00* (2006.01)
(52) U.S. Cl. ................ 714/763; 714/755
(58) Field of Classification Search ............ 714/755, 714/763
See application file for complete search history.

(56) References Cited

U.S. PATENT DOCUMENTS 7,055,082 B2 * 5/2006 Mori et al. ............... 714/768
7,395,488 B2 * 7/2008 Finkelstein et al. ........ 714/763
7,444,579 B2 * 10/2008 Radke et al. .............. 714/763

* cited by examiner

*Primary Examiner*—Esaw T Abraham
(74) *Attorney, Agent, or Firm*—Jordan C. Powell

(57) ABSTRACT

An apparatus and method are disclosed for error correction code ("ECC") striping. A memory receives sets of data in an original order. The memory stores the sets of data row by row in rows and columns such that user data in each row follows the original order. Each set of data is stored in a different row. An ECC data generator is coupled to the memory. The ECC data generator generates ECC data for each set of data in each row. The ECC data generator appends the generated ECC data to an end of each corresponding row. A modulator device is also coupled to the memory. The modulator device extracts the combined sets of data and ECC data in a striped order comprising a column by column order. A column comprises data from each row.

7 Claims, 3 Drawing Sheets

APPARATUS AND METHOD FOR ERROR CORRECTION CODE STRIPING

BACKGROUND OF THE INVENTION

The invention relates to the field of error correction codes, and in particular to applications traditionally requiring product error correction codes.

An error correction code (ECC) assists in locating errors in digital data, and allows a predetermined number of errors to be corrected. The ability to detect and correct errors is accomplished by adding redundant information to the data according to a specific algorithm. Each bit of redundant information is generated based on the original data bits.

Block error correction codes are used for fixed-size blocks of data. Examples of block error correction codes include Reed-Solomon, Golay, and Hamming codes. Block codes are widely used to protect the accuracy of data stored on digital storage media, or transmitted digitally.

In error correction coding, each block of data may be organized into rows and columns. In order to increase the number and range of possible errors that can be corrected by the ECC scheme in a block of data, error correction data is often calculated both for each row and for each column of data in the block. This method of using both row and column error correction codes in a single block of data is referred to as a product code or a two dimensional block error correction code. The increase in ability to correct errors using a product code also introduces an increase in the amount of redundant information added to the data since ECC data must be added for both rows and columns. This increase in the amount of error correction data in turn decreases the amount of original user data that can be stored or transmitted.

As illustrated in FIG. 1, user data 30, protected by a product code ECC scheme, is organized into rows and columns (see rows 1-U and columns 1-V). Each column is typically one byte of data but may be any number of bits pertaining to an ECC symbol (10 bits for example). It should be noted that user data itself may already include some type of error correction or error detection code such as a cyclic redundancy check (CRC). ECC data is calculated for each row of user data according to the ECC scheme employed, which may be Reed-Solomon, Golay, Hamming, or any other block ECC. This data is then appended to the end of each row. Additional ECC data is also calculated for each column, and placed at the bottom of each column. This entire block, including both user and ECC data, can then be stored or transmitted. The symbols are typically stored or transmitted beginning with the symbol occupying row 1 (20), column 1 (10), followed by the remaining symbols in row 1 (20), proceeding towards column Y (14). Each row is then stored or transmitted in a similar order, proceeding towards row X (24) until the entire block has been completed.

Some errors can be corrected using only the row ECC data, but if an individual row contains too many errors for the respective row ECC scheme to correct, then the column ECC data must also be used to correct the errors. This means that in most cases the entire block is accessed whenever any of the user data is accessed.

Many applications frequently involve errors that require both the row and column ECC data to correct. Errors due to scratches or other defects in digital storage media, or due to certain types of interference in either wired or wireless digital communications are more likely to occur in groups than individually. Although using a product code as described can correct a large amount of contiguous errors, a significant overhead of additional ECC data is introduced by the scheme. This data overhead decreases the actual user data storage capacity or throughput and increases the overall complexity of the system.

BRIEF SUMMARY

From the foregoing discussion, it should be apparent that a need exists for an apparatus, system, and method that correct errors in groups of contiguous data. Beneficially, such an apparatus, system, and method would also decrease the amount of ECC data used to detect and correct errors.

The present invention has been developed in response to the present state of the art, and in particular, in response to the problems and needs in the art that have not yet been fully solved by currently available ECC systems. Accordingly, the present invention has been developed to provide an apparatus and method that overcome many or all of the above-discussed shortcomings in the art.

A method of the present invention is presented for ECC striping. In one embodiment, the method includes receiving user data in a first ordered manner. The method also may include organizing said user data into rows and columns. In a further embodiment, the method includes calculating ECC data for each of said rows. The method, in another embodiment, includes appending said ECC data to each of said rows wherein the ECC data calculated for a given of said rows is appended to that specific given of said rows. In one embodiment, the method includes sending combined user data and ECC data in a second ordered manner.

In one embodiment, receiving user data comprises receiving user data having an initial set of ECC data included therein. In a further embodiment, the step of sending combined user data and ECC data comprises sending combined user data and ECC data column by column.

An encoder apparatus is provided with a plurality of modules configured to functionally execute the necessary steps of encoding ECC striping. These modules in the described embodiments include a memory, an ECC data generator, and a device.

The memory, in one embodiment, is configured to receive sets of data in a first ordered manner. In a further embodiment, the memory stores the sets of data in rows and columns. The memory, in another embodiment, stores each set of data in a different row from the other sets of data. In one embodiment, the data has an initial set of ECC data included therein, in a further embodiment, the memory is also part of a decoder.

The ECC data generator, in one embodiment, is coupled to the memory. In another embodiment, the ECC data generator generates ECC data for each of the sets of data in each of the rows. In a further embodiment, the ECC data generator appends the generated ECC data to the set of data for its respective row.

The device, in one embodiment, is coupled to the memory. In a further embodiment, the device extracts the combined sets of data and ECC data in a second ordered manner. In one embodiment, the device extracts the combined sets of data and ECC data column by column. In another embodiment, the device comprises a modulator that modulates the combined sets of data and ECC data for a specific channel.

A decoder apparatus is provided with a plurality of modules configured to functionally execute the necessary steps of decoding ECC striping. These modules in the described embodiments include a first device, a memory, an ECC decoder and data corrector, and a second device.

The first device, in one embodiment, extracts data encoded in a first ordered manner. In a further embodiment, the first ordered manner is column by column. In another embodiment, the first device comprises a demodulator that demodulates the data from a specific channel. Each set of data, in one embodiment, has an initial set of ECC data included therein.

The memory, in one embodiment, is coupled to the first device. In another embodiment, the memory receives the encoded data. In one embodiment, the memory stores the data in rows and columns in a second ordered manner such that each of the rows contain a set of data and ECC data calculated for the set of data. In a further embodiment, the memory is also part of an encoder circuit. The second device, in one embodiment, extracts the sets of data in the second ordered manner.

The ECC decoder and data corrector, in one embodiment, are coupled to the memory. In another embodiment, the ECC decoder and data corrector receive the data from the memory in the second ordered manner. The ECC decoder and data corrector, in a further embodiment, use the ECC data to correct errors in the set of data, and send the error corrections to the memory.

These features and advantages of the present invention will become more fully apparent from the following description and appended claims, or may be learned by the practice of the invention as set forth hereinafter.

DETAILED DESCRIPTION OF THE INVENTION

The present invention decreases the amount of ECC data required to detect and correct errors in digital data while still maintaining a specified ability to correct errors in large groups of contiguous data. The present invention accomplishes this by placing distance either in space or in time between related symbols. Related symbols are symbols that are grouped together mathematically for ECC calculations. An error affecting contiguous symbols, like scratches or other defects in digital storage media, or certain types of interference in either wired or wireless digital communications, would affect many ECC groups, but would only affect one symbol from each group. Because only one symbol from each group is affected, the error can easily be corrected using a one dimensional ECC, removing the need for the two dimensional product code ECC and its data overhead.

Figure 1:
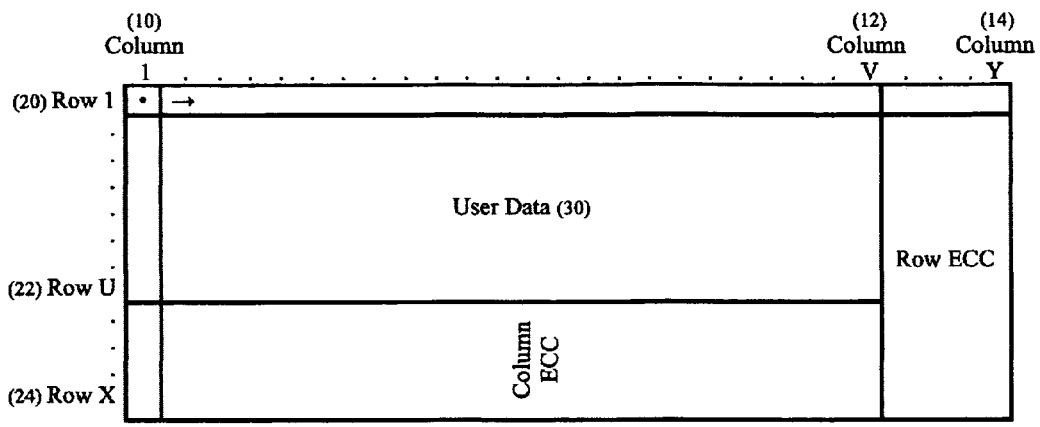
FIG. 1 shows a prior art product code error correction scheme.
Figure 2:
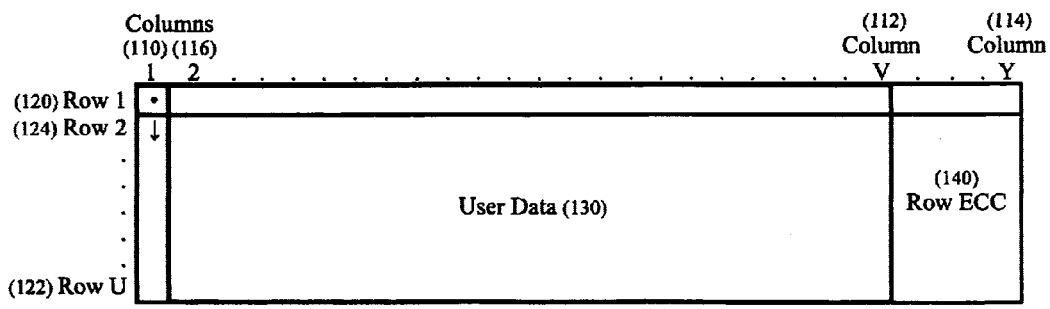
FIG. 2 shows a first embodiment of the present invention.

As can be seen in FIG. 2 in a first embodiment of the present invention, the user data, which may include a CRC or other error detection or correction data, is organized into rows and columns. Each column may be one byte, or any other fixed amount of data. ECC data is calculated for each row of user data according to the ECC scheme employed, which may be Reed-Solomon, Golay, Hamming, or any other block ECC. The calculated ECC data for each row is then appended to the row. No column ECC data is calculated or used. An ECC scheme where each data symbol is included in only one ECC calculation is referred to as a one dimensional ECC scheme.

The block of data is then written to the digital storage media or transmitted. The first symbol to be written or transmitted is again the symbol occupying row 1 (120), column 1 (110). Instead of proceeding along row 1 (120), the next symbol written or transmitted is the symbol occupying row 2 (124), column 1 (110). Each symbol in column 1 (110) is then stored or transmitted, ending with the symbol occupying row U (122) column 1 (110). Once column 1 (110) has been stored or transmitted, column 2 (116) is then transmitted, beginning with the symbol occupying row 2 (124), column 1 (110), and proceeding to the symbol occupying row U (122) column 2 (116). Each column is stored or transmitted, proceeding in order toward column Y (114) until the entire block, including column Y (114) has been stored or transmitted. This includes row ECC data 140, which is stored or transmitted by column in the same manner as user data 130. Prior to storage or transmission, the data may first be copied to a memory buffer in this new ECC striped order to facilitate the storing or transmitting step.

Because of the ECC striping, meaning the out of order column by column manner in which the data is stored or transmitted, the entire data block must be read or received in order to use the data in its original order, or to correct the data with the row ECC which is stored or transmitted last. The effect is the same as if row and column ECC data were produced using the product code scheme—an entire block of data must be read or received rather than an individual row of data.

Notice that because of the ECC striping, even if an entire column is lost to contiguous errors, only one symbol from each ECC group is lost, and can easily be corrected. The correction ability of the ECC scheme employed should be chosen based upon the number and type of errors expected.

Figure 3:
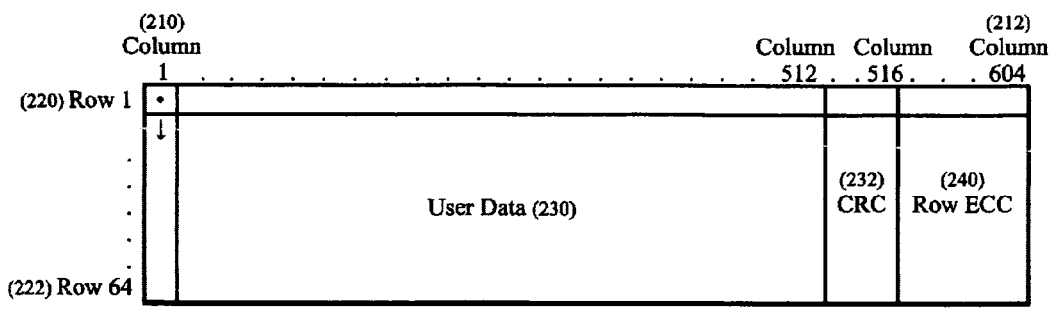
FIG. 3 shows a second embodiment of the present invention.

FIG. 3 shows a second embodiment of the present invention comprising a specific implementation for explanation purposes. Note that specific rows and columns and symbols are used for explanation, but any number of implementations will fit within the scope of the present invention. A block of user data 230 has 64 rows. Each row contains 512 bytes of user data, and a 4 byte CRC 232. Appended to each row of user data is an 88 byte Reed-Solomon ECC field 240, computed over the row. This is a total of 38,656 bytes in the block, including both the user data 230 and the ECC data 240. If a product code ECC scheme had been used, and a 7 byte column ECC calculated and appended to each column, the total would be 42,884 bytes. The present invention results in a block size decrease of 4,228 bytes, or nearly ten percent, without a decrease in user data, while preserving the ability to correct errors in large groups of contiguous data.

Figure 4:
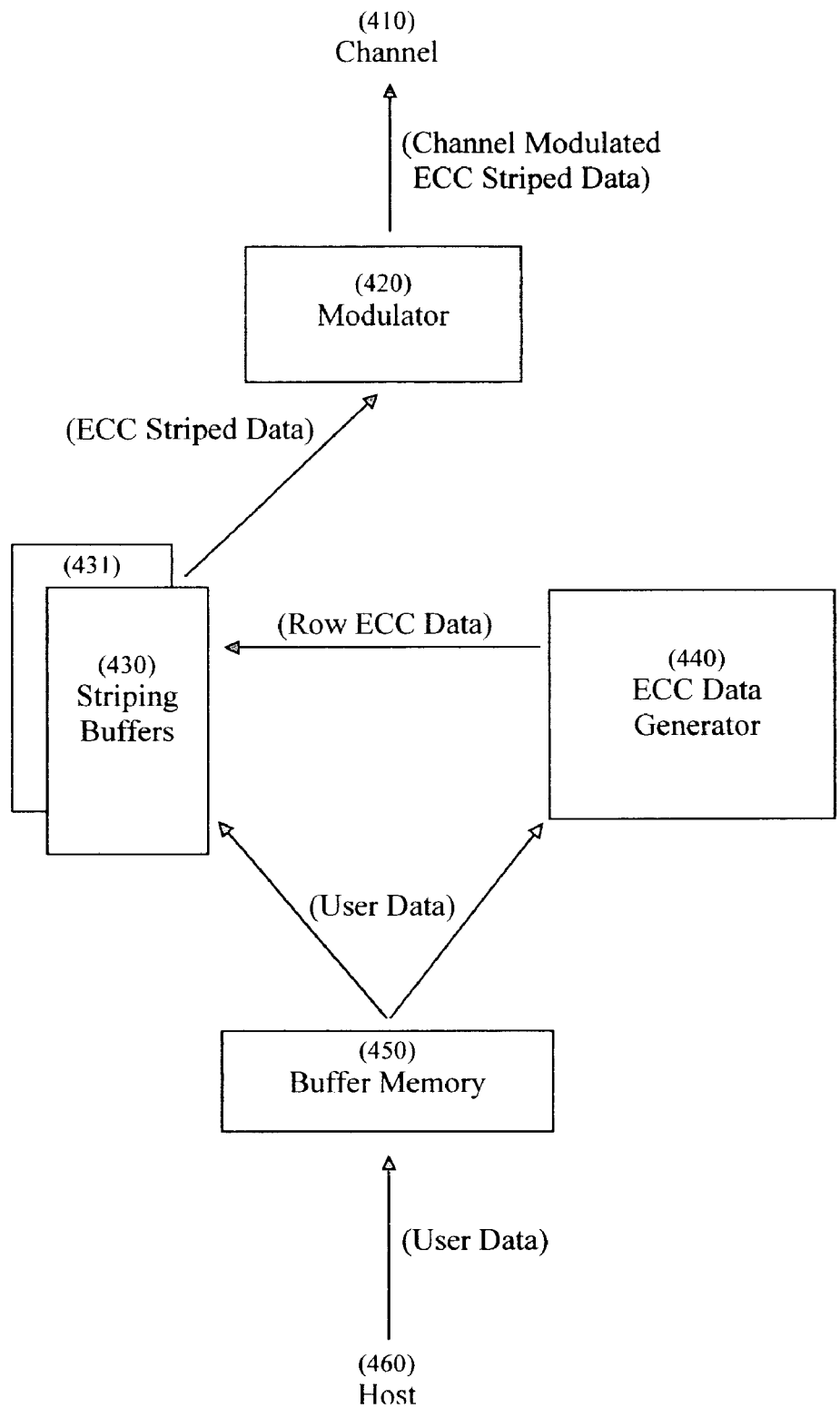
FIG. 4 shows an embodiment of an encoding portion of the present invention.

An embodiment of the process flow of an encoder stage of the present invention is illustrated in FIG. 4. In FIG. 4 user data from host 460 is written to buffer memory 450. Host 460 may be any device utilizing the present invention, including electronic devices involved in data communication or storage. It should be noted that the user data may have already been processed by other systems, including other ECC systems, before being written to buffer memory 450. The user data is then sent from buffer memory 450 to both striping buffer 430 and to ECC data generator 440. Row ECC data is calculated by ECC data generator 440 according to the ECC scheme employed (eg. Reed-Solomon, Golay, Hamming). The row ECC data is then sent to striping buffer 430 for inclusion in the data block at the end of the user data according to the present invention. The entire data block, including both user data and ECC row data, is then sent from striping buffer 430 to modulator 410 in column by column order according to the present invention to be modulated and written to channel 410. Although a single striping buffer 430 may be used, using multiple striping buffers, 430 and 431, allows data to be read into one of the striping buffers, 430 or 431, from buffer memory 450 while data is being written to modulator 420 from the other striping buffer, 430 or 431. If multiple striping buffers are used, they will alternate tasks. This increases encoding speed and data throughput. Channel 410 may be the write channel of a data storage system, a communications channel, or any other medium.

Figure 5:
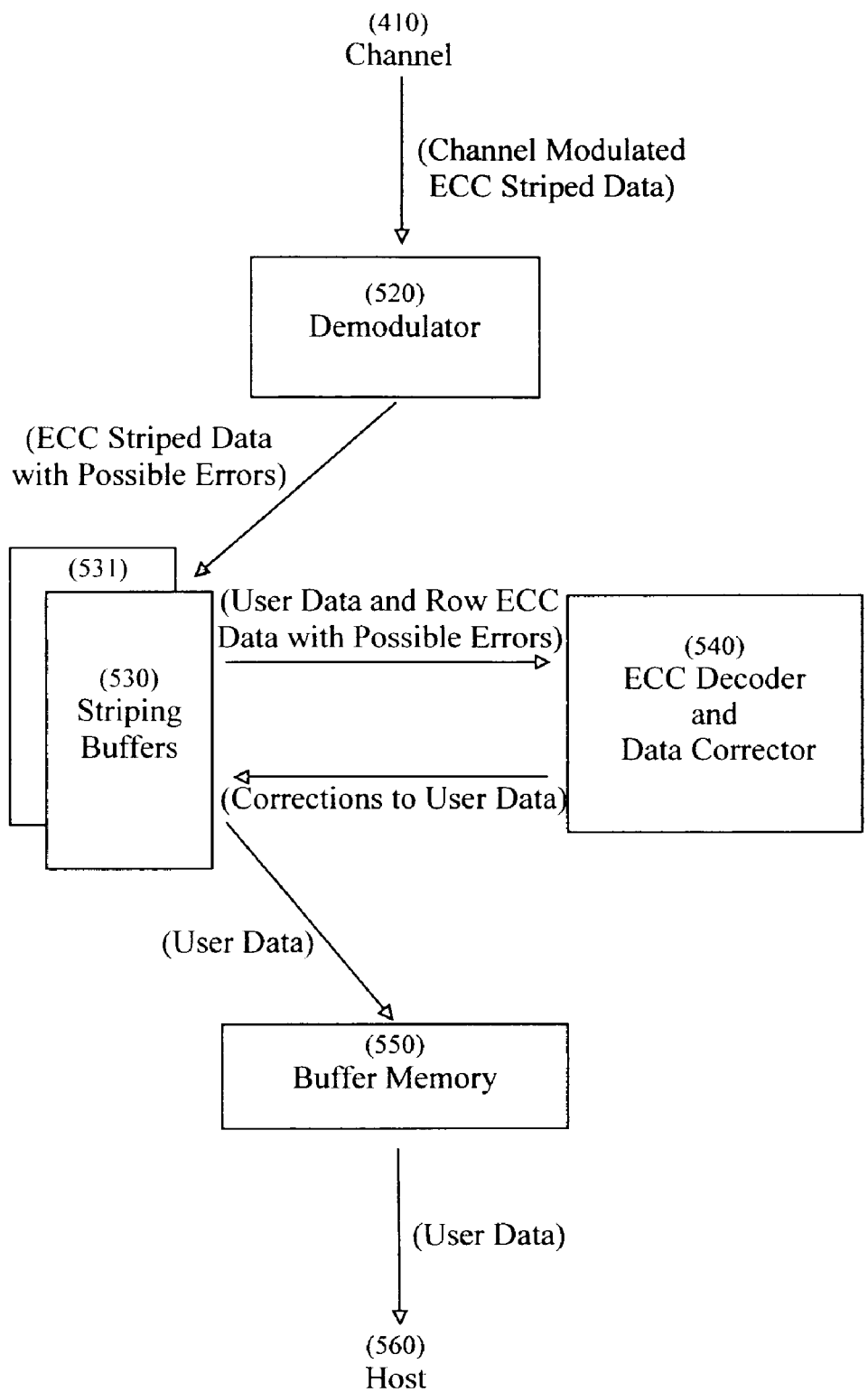
FIG. 5 shows an embodiment of a decoding portion of the present invention.

FIG. 5 shows an embodiment of the decoder stage of the present invention. Channel modulated data that has been encoded according to the present invention is first read from channel 410 and demodulated by demodulator 520. The data read from channel 410 may contain errors introduced by storage or transmission medium (for instance introduced by a scratch on the medium) and is still in ECC striped order. Next the data is written to striping buffer 530 by column, which returns the data to its original order. The data is then sent, in its original order but still containing possible errors, to the ECC decoder and data corrector 540. ECC decoder and data corrector 540 will decode the row ECC data according to the ECC scheme employed (as explained earlier) and use the ECC data to correct any errors introduced into the data by the channel 410. The data in striping buffer 530 is then modified to include the corrections made by ECC decoder and data corrector 540. Once all modifications have been made, the corrected data can be written to buffer memory 550 and then sent to host 560. Again, while only one striping buffer 530 is necessary for decoding, if multiple striping buffers 530 and 531 are used, data can be written to one of the striping buffers, 530 or 531, from demodulator 520 while corrected data is being written to buffer memory 550 from the other striping buffer, 530 or 531, thereby increasing decoding speed and data throughput. If an ECC scheme was chosen that has the ability to correct all of the errors introduced by the channel, the user data will be identical to the original user data that was encoded and written to the channel. If a CRC or any other information or processing was added to the user data prior to encoding, the data may be sent to other systems before being sent to host 560.

It should be noted that in applications where data is not read and written simultaneously, buffer memory 450 and striping buffers 430 and 431 from the encoder in FIG. 4 may also be used for buffer memory 550 and striping buffers 530 and 531 from the decoder in FIG. 5. Host 560 from FIG. 5 may also be the same device as host 460 from FIG. 4, or a second device which also has access to channel 410.

Although the description of the present invention has utilized various embodiments, it will be recognized that the present invention is not limited to the specific embodiments described. Rather, the present invention encompasses all variants incorporating the essence of the ideas presented in the above description.

A third embodiment of the present invention is structured similar to the second embodiment of FIG. 3 except that each symbol size is 10 bits wide rather than 8 and there are 464 user symbols of 10 bits each. Each row has 112 ECC symbols appended for a total row size of 576 symbols. Operation of the third embodiment is the same as that of the second embodiment of FIG. 3.

What is claimed is:

1. A method comprising:
    receiving user data in an original order;
    organizing the user data row by row into rows and columns such that user data in each row follows the original order;
    calculating error correction code ("ECC") data for the user data in each row;
    appending the ECC data to an end of each row, wherein the ECC data calculated for a corresponding row is appended to an end of the corresponding row; and
    sending the user data and the appended ECC data to a data storage device in a striped order, the striped order comprising a column by column order, a column comprising data from each row.

2. The method of claim 1, wherein receiving user data comprises receiving user data having an initial set of ECC data included therein.

3. An encoder comprising:
    a memory that receives sets of data in an original order and stores the sets of data row by row in rows and columns wherein each set of data is stored in a row in the original order;
    an error correction code ("ECC") data generator coupled to the memory, the ECC data generator generating ECC data for each set of data, the ECC data generator appending the generated ECC data for a set of data to an end of a row corresponding to the set of data; and
    a device coupled to the memory, the device extracting the sets of data and the appended ECC data in a striped order, the striped order comprising a column by column order, a column comprising data from each row.

4. The encoder of claim 3, wherein the device coupled to the memory comprises a modulator that modulates the sets of data and the appended ECC data for a specific channel in the striped order.

5. The encoder of claim 3, wherein each set of data has an initial set of ECC data included therein.

6. The encoder of claim 3, wherein the memory is also part of a decoder.

7. The encoder of claim 3, wherein the memory comprises a first striping buffer and a second striping buffer, the first and second striping buffer configured to alternate tasks such that the first striping buffer receives sets of data concurrent with the device extracting sets of data from the second striping buffer, and the second striping buffer receives sets of data concurrent with the device extracting sets of data from the first striping buffer.

* * * * *